(12) United States Patent
Ren

(10) Patent No.: US 10,383,236 B2
(45) Date of Patent: Aug. 13, 2019

(54) MANUFACTURING METHOD FOR CIRCUIT BOARD BASED ON COPPER CERAMIC SUBSTRATE

(71) Applicant: SHUNSIN TECHNOLOGY (ZHONG SHAN) LIMITED, Zhongshan (CN)

(72) Inventor: Fei Ren, Shenzhen (CN)

(73) Assignee: SHUNSIN TECHNOLOGY (ZHONG SHAN) LIMITED, Zhongshan (CN)

( * ) Notice: Subject to any disclaimer, the term of this patent is extended or adjusted under 35 U.S.C. 154(b) by 177 days.

(21) Appl. No.: 15/224,650

(22) Filed: Jul. 31, 2016

(65) Prior Publication Data
US 2017/0303404 A1    Oct. 19, 2017

(30) Foreign Application Priority Data

Apr. 13, 2016    (CN) .......................... 2016 1 0226397

(51) Int. Cl.
*H01K 3/22*     (2006.01)
*H05K 3/38*     (2006.01)

(52) U.S. Cl.
CPC ............ *H05K 3/385* (2013.01); *H05K 3/381* (2013.01); *H05K 2203/0315* (2013.01)

(58) Field of Classification Search
CPC . H05K 3/381; H05K 3/385; H05K 2203/0315
See application file for complete search history.

(56) References Cited

U.S. PATENT DOCUMENTS

| | | | |
|---|---|---|---|
| 4,985,097 A | 1/1991 | Matsumura et al. | |
| 5,155,665 A | 10/1992 | Komorita et al. | |
| 8,683,682 B2 * | 4/2014 | Schulz-Harder | ...... C04B 37/021 29/831 |
| 2009/0152237 A1 | 6/2009 | Chiang et al. | |
| 2010/0288536 A1 * | 11/2010 | Chiang | ............... H01L 23/3677 174/252 |
| 2012/0014069 A1 * | 1/2012 | Zeng | ................... H01L 23/4334 361/718 |
| 2014/0291699 A1 * | 10/2014 | Yano | ..................... C04B 37/026 257/77 |
| 2016/0165749 A1 * | 6/2016 | Hong | .................. H01L 23/3677 361/715 |

FOREIGN PATENT DOCUMENTS

| | | | |
|---|---|---|---|
| CN | 101877318 B | | 4/2009 |
| CN | 202423382 U | | 9/2012 |
| CN | 104064478 | | 9/2014 |
| JP | 04018789 A | * | 1/1992 |
| TW | 201306681 | | 2/2013 |

\* cited by examiner

*Primary Examiner* — Paul D Kim
(74) *Attorney, Agent, or Firm* — ScienBiziP, P.C.

(57) ABSTRACT

A manufacturing method for circuit board on copper ceramic substrate comprises stamping a copper sheet into a copper circuit board in a shape matching a ceramic substrate, fitting the copper circuit board to the ceramic substrate and sintering the copper circuit board and the ceramic substrate together by direct bonding copper.

7 Claims, 4 Drawing Sheets

MANUFACTURING METHOD FOR CIRCUIT BOARD BASED ON COPPER CERAMIC SUBSTRATE

FIELD

The present disclosure generally relates to the field of ceramic substrate metallization technology; and more particularly to manufacturing methods for copper ceramic substrates.

BACKGROUND

Direct Bonding Copper (DBC) is a technology that applies a heat treatment at a temperature lower than melting point of copper (about 1083° C.) and higher than eutectic temperature of copper and copper oxide (about 1063° C.) to make a eutectic bond and fix the external structure and copper together. Copper ceramic substrate is a typical product of DBC, and mainly used in the field of product packaging requiring high power and high heat dissipation.

FIG. 1 illustrates the process flow of the manufacturing method for copper ceramic substrate in related technology. FIG. 2 is a structural view of the copper ceramic substrate of FIG. 1. As shown in FIG. 1 and FIG. 2, typical machining process for manufacturing the copper ceramic substrate in related technology includes the following:
fitting a ceramic substrate 20 to a copper sheet 10;
sintering the ceramic substrate 20 and the copper sheet 10;
etching copper layer into copper circuit board 10';
forming a protecting layer on the surface of the copper layer. Step c includes the steps of padding pasting, exposing, developing, etching, and stripping film, etc. In the related technology, the etching process is made complicated as large amounts of materials and additional equipment are required for the manufacturing the copper ceramic substrate, which nevertheless introduces defects in the process. Since substantially large amounts of copper dissolves in the etching liquid, leftover material is inconvenient for recycling and difficult to process with wastewater treatment causing adverse environmental issues. Moreover, lines of copper circuit board made by etching are not of uniform depth or upright, which decreases insulation performance. Thus, a complex manufacturing process contains serious environmental and performance issues, and subsequently, the cost effectiveness and benefits of the process are seriously lacking.

BRIEF DESCRIPTION OF THE DRAWINGS

Implementations of the present technology will now be described, by way of example only, with reference to the attached figures, wherein.

DETAILED DESCRIPTION

Figure 1:
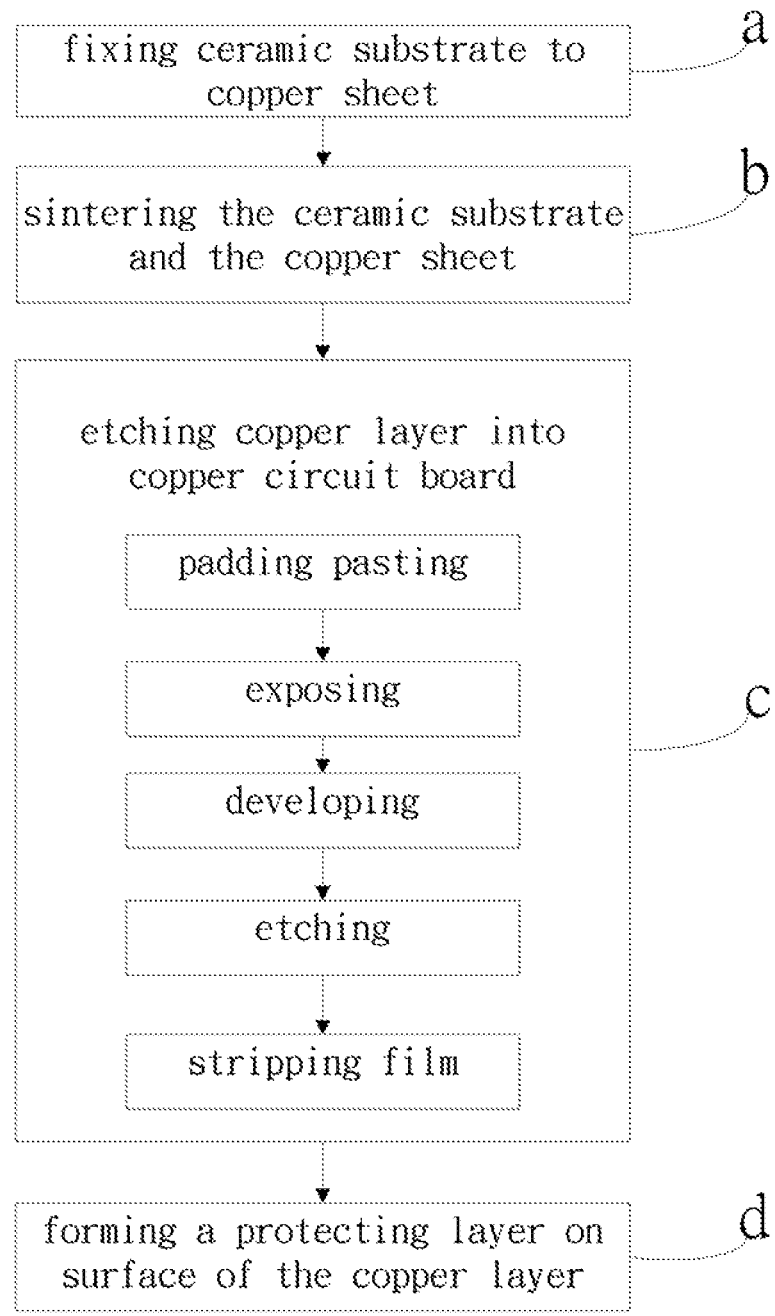
FIG. 1 is a process flow of the manufacturing method of copper ceramic substrate in related technology.
Figure 2:
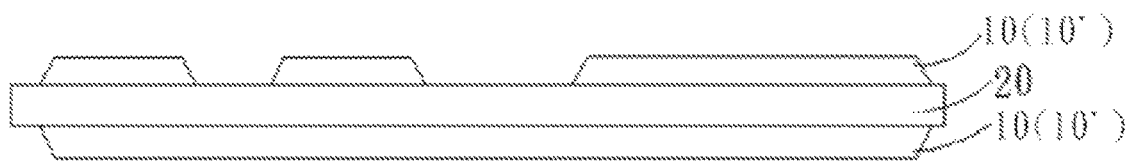
FIG. 2 is a structural view of the copper ceramic substrate of FIG. 1.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Figure 3:
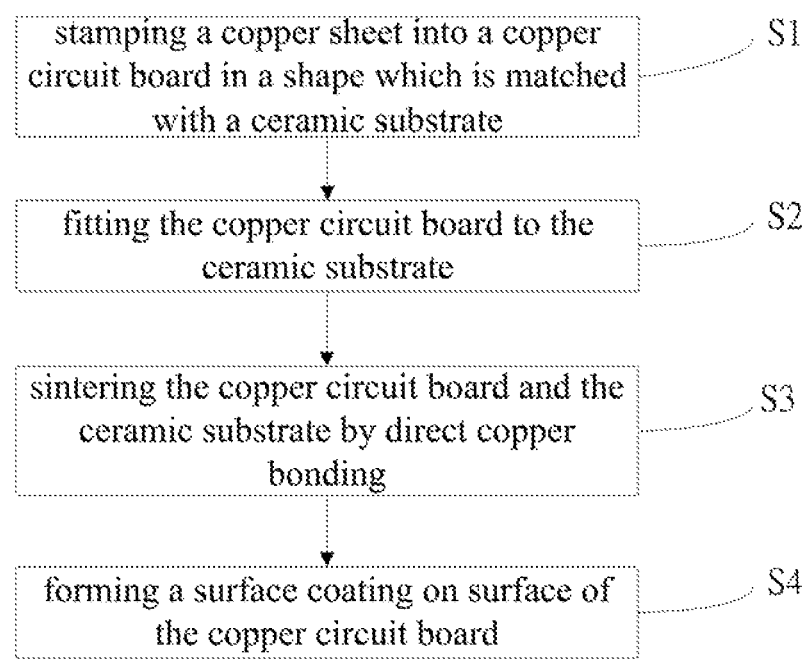
FIG. 3 is a process flow of the manufacturing method of copper ceramic substrate in one embodiment of the present disclosure.
Figure 4:
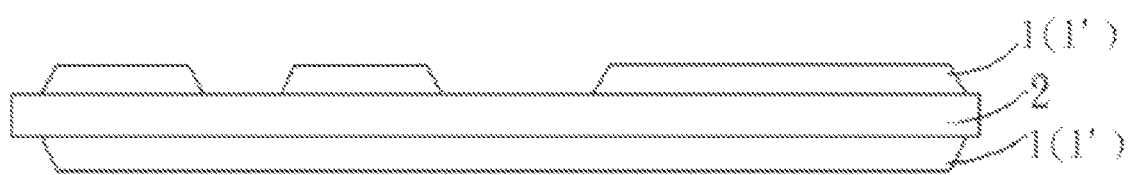
FIG. 4 is a structural view of the copper ceramic substrate of FIG. 3.

As shown in FIG. 3, the manufacturing method for copper ceramic substrates of the present disclosure includes at least the following steps:

In S1, stamping a copper sheet 1 into a copper circuit board 1' in a shape matching a ceramic substrate 2.

In S2, fitting the copper circuit board 1' to the ceramic substrate 2.

In S3, sintering the copper circuit board 1' and the ceramic substrate 2 by direct bonding copper (DBC) process. The copper circuit board 1' formed by stamping has uniform side walls of uniform depth, which are vertical to the ceramic substrate 2, and the circuit board 1 formed in this manner has the benefits of good insulation performance, simple manufacturing process, and low cost. In the illustrated embodiment, the copper circuit board 1' and the ceramic substrate 2 are sintered by heating to oxidation. The thickness of the copper circuit board 1' is from 20 um to 150 um. The oxidation temperature is from 950 to 1100 degrees Celsius, and the oxidation time is from 20 minutes to 35 minutes. In the oxidation heating process, the oxidation atmosphere comprises a weak oxygen atmosphere under the protection of and mixed with inert gas. The inert gas may be one of $N_2$, Ar or He, and the oxygen content may be set to be from 60 ppm to 280 ppm. In the process of oxidation heating, a $Cu$—$Cu_2O$ eutectic liquid phase is produced where the copper circuit board 1' is combined with the ceramic substrate 2. The ceramic substrate 2 and the copper produce a eutectic state to fix with each other. In other words, the $Cu$—$Cu_2O$ eutectic liquid produced by copper and cuprous oxide is used as a binder whereby the copper circuit board 1' becomes one entity with the ceramic substrate 2.

The copper ceramic substrate made by the manufacturing method of the disclosure has a peel strength of more than 60 N/cm and the advantages of good thermal conductivity, hot and cold impact resistance, and high temperature integrity. The copper ceramic substrate is suitable for the chip substrates in all kinds of power modules. The absence of an independent binder to connect the copper circuit board 1' with the ceramic substrate 2 means that the thickness of the middle transition layer is significantly reduced, which decreases the thermal resistance from metallized layer to the ceramic substrate 2, improves heat dissipation, and becomes ideal for the field of product packaging requiring high power and high heat dissipation.

In the illustrated embodiment, one side of the ceramic substrate 2 may be fixed with the copper circuit board 1' in S2, and sintered to form a single sided board in S3. Alternatively, both sides of the ceramic substrate 2 may be fixed with a copper circuit board 1' in S2, and sintered to form a double sided board in S3, according to demand.

In the illustrated embodiment, following the process of S3, the process of S4 may also be included:

In S4, forming a surface coating on the surface of the copper circuit board which is sintered in S3. For example, a Zn layer, a Cr layer, or a Sn layer can be formed on the copper circuit board by vapor deposition. In other embodiments, an Fe layer, a Ti layer, or an Al layer can be formed on the copper circuit board by magnetron sputtering.

The exemplary embodiments shown and described above are only examples. Many details are often found in the art such as the other features of manufacturing method for copper ceramic substrate. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A manufacturing method for copper ceramic substrates, comprising:
   stamping a copper sheet into a copper circuit board in a shape matching a ceramic substrate;
   fitting the copper circuit board to the ceramic substrate;
   sintering the copper circuit board and the ceramic substrate by direct copper bonding; and
   magnetron sputtering a surface coating of one of a Fe layer, a Ti layer, or a Al layer on the copper circuit board following the process of sintering the copper circuit board.

2. The method of claim 1, wherein one side of the ceramic substrate is fixed with the copper circuit board by the process of fitting the copper circuit board, and sintered to form a single sided board by the process of sintering the copper circuit board.

3. The method of claim 1, wherein both sides of the ceramic substrate are fixed respectively with the copper circuit board by the process of fitting the copper circuit board, and sintered to form a double sided board by the process of sintering the copper circuit board.

4. The method of claim 1, wherein the copper circuit board and the ceramic substrate are sintered by heating oxidation, an oxidation temperature is from 950° C. to 1100° C., and the oxidation time is from 20 minutes to 35 minutes during the process of sintering the copper circuit board.

5. The method of claim 4, wherein during the process of heating oxidation, an oxidation atmosphere comprises an oxygen content under protection of inert gas, the oxygen content is from 60 ppm to 280 ppm.

6. The method of claim 5, wherein the inert gas is one of $N_2$, Ar or He.

7. The method of claim 1, wherein a thickness of the copper circuit board is from 20 um to 150 um.

* * * * *